(12) United States Patent
Hudait et al.

(10) Patent No.: US 7,687,799 B2
(45) Date of Patent: Mar. 30, 2010

(54) METHODS OF FORMING BUFFER LAYER ARCHITECTURE ON SILICON AND STRUCTURES FORMED THEREBY

(75) Inventors: Mantu K. Hudait, Portland, OR (US); Peter G. Tolchinsky, Beaverton, OR (US); Loren A. Chow, Santa Clara, CA (US); Dmitri Loubychev, Bethlehem, PA (US); Joel M. Fastenau, Bethlehem, PA (US); Amy W. K. Liu, Mountain View, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 12/214,737

(22) Filed: Jun. 19, 2008

(65) Prior Publication Data

US 2009/0315018 A1    Dec. 24, 2009

(51) Int. Cl.
*H01L 31/00*    (2006.01)
*H01L 21/338*    (2006.01)

(52) U.S. Cl. .................. 257/14; 257/194; 438/172; 438/478

(58) Field of Classification Search .............. 257/14, 257/194, 615, 628; 438/172, 478
See application file for complete search history.

(56) References Cited

U.S. PATENT DOCUMENTS 7,566,898 B2 *   7/2009   Hudait et al. ............... 257/24
2008/0029756 A1 *   2/2008   Hudait et al. ............... 257/14

* cited by examiner

*Primary Examiner*—Mark Prenty
(74) *Attorney, Agent, or Firm*—Kathy J. Ortiz

(57) ABSTRACT

Methods and associated structures of forming a microelectronic device are described. Those methods may include forming a GaSb nucleation layer on a substrate, forming a Ga(Al)AsSb buffer layer on the GaSb nucleation layer, forming an $In_{0.52}Al_{0.48}As$ bottom barrier layer on the Ga(Al)AsSb buffer layer, and forming a graded $In_xAl_{1-x}As$ layer on the $In_{0.52}Al_{0.48}As$ bottom barrier layer thus enabling the fabrication of low defect, device grade InGaAs based quantum well structures.

20 Claims, 6 Drawing Sheets ns of the present invention enable the growth of III-V materials upon silicon substrates with matched lattice, thermal and polar properties.

METHODS OF FORMING BUFFER LAYER ARCHITECTURE ON SILICON AND STRUCTURES FORMED THEREBY

BACKGROUND OF THE INVENTION

A variety of electronic and optoelectronic devices can be enabled by developing thin film relaxed lattice constant III-V semiconductors on elemental silicon (Si) substrates. Surface layers capable of achieving the performance advantages of III-V materials may host a variety of high performance electronic devices such as complementary metal oxide semiconductor (CMOS) and quantum well (QW) transistors fabricated from extreme high mobility materials such as, but not limited to, indium antimonide (InSb), indium gallium arsenide (InGaAs) and indium arsenide (InAs).

BRIEF DESCRIPTION OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

DETAILED DESCRIPTION OF THE PRESENT INVENTION

Figure 1A:
FIGS. 1a-1g represent structures according to an embodiment of the present invention.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein, in connection with one embodiment, may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

Methods and associated structures of forming a microelectronic structure are described. Those methods may include forming a GaSb nucleation layer on a substrate, forming a Ga(Al)AsSb graded buffer layer on the GaSb nucleation layer, forming a lattice matched InAlAs bottom barrier on the graded buffer layer, and forming a graded $In_xAl_{1-x}As$ buffer on the bottom barrier. An InGaAs device layer may then be grown on the graded $In_xAl_{1-x}As$ buffer, which may serve as a barrier layer as well as device isolation layer for a metamorphic high electron mobility transistor (HEMT) application.

Methods of the present invention enable the growth of III-V materials upon silicon substrates with matched lattice, thermal and polar properties.

Crystal defects may be generated by lattice mismatch, polar-on-nonpolar mismatch and thermal mismatch between III-V semiconductor epitaxial layers and silicon semiconductor substrates. Such mismatch can lead to poor electrical characteristics such as low carrier mobility and high leakage. When the lattice mismatch between an epitaxial layer and a substrate exceeds a few percent, the strain induced by the mismatch can becomes too great and defects may be generated in an epitaxial layer when such an epitaxial film relaxes the lattice mismatch strain.

Many defects, such as threading dislocations and twins, tend to propagate into the "device layer" where a semiconductor device may be located. These defects can cause severe problems for integrating high-quality InGaAs material on silicon substrates. Prior art structures of high quality InGaAs thin films formed on silicon with GaAs coated on silicon have been shown to comprise large numbers of defects and dislocations, which can be in the order of about 1e10 $cm^{-2}$. The embodiments of this invention enable the fabrication of low defect, device grade InGaAs layer and InGaAs-based QW structures on silicon while preserving excellent structural and electrical properties.

FIGS. 1a-1g illustrate an embodiment of a method of forming a microelectronic structure, such as an indium gallium arsenide (InGaAs)-based semiconductor devices, for example. In some embodiments, a buffer architecture may be formed for integrating high electron mobility n-channel InGaAs device structures on a silicon substrate for low power and high speed III-V compound semiconductor based complementary metal on silicon (CMOS) device applications. In some embodiments, the buffer architecture may bridge material mismatch issues between an active InGaAs channel layer and a silicon substrate.

FIG. 1a illustrates a cross-section of a portion of a substrate 100, such as a silicon substrate, for example. In an embodiment, the structure 100 may comprise a substrate 100 that may comprise a high resistivity, such as but not limited to about 1 ohm-cm to about 50 kohm-cm, for example, and may be an n or a p-type silicon substrate. In various embodiments, the substrate 100 may be a high resistivity n or p-type (100) off-oriented silicon substrate 100, although the scope of the present invention is not limited in this regard. In an embodiment, the substrate 100 may have a vicinal surface prepared by off-cutting the substrate 100 from an ingot.

The substrate 100 may be off cut at an angle between about 2 and about 8 degrees towards the (110) direction to produce a surface having terraces in one embodiment. In other embodiments, other off cut orientations or a substrate 100 without an off cut may be used. Such a high resistivity substrate 100 may provide for device isolation. Furthermore, off-cutting of the substrate 100 may eliminate anti-phase domains in anti-phase boundaries when growing subsequent layers upon the substrate 100, such as subsequent III-V layers that may be grown upon the substrate 100, for example.

Figure 1B:
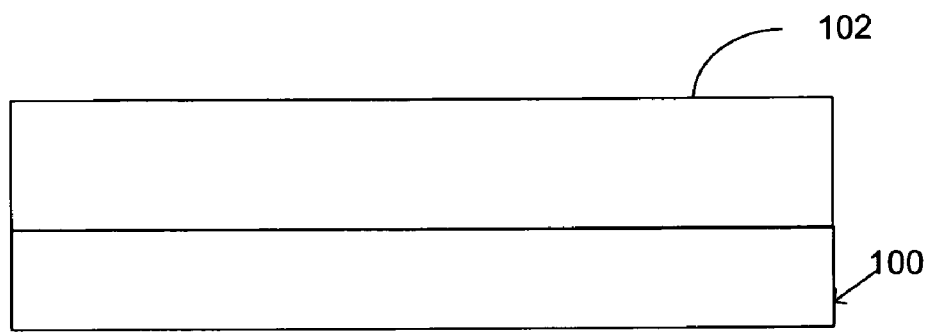

A nucleation layer 102 may be formed on the substrate 100 (FIG. 1b). The nucleation layer 102 may comprise a very thin, low melting point material, such as GaSb in an embodiment. In an embodiment, the nucleation layer 102 may comprise a low bandgap GaSb nucleation layer 102. In an embodiment, the GaSb nucleation layer 102 may comprise a thickness between about 50 angstroms to about 300 angstroms. The GaSb nucleation layer 102 may eliminate antiphase domains and may facilitate the creation of a virtual polar substrate 100. The relatively low melting point of the GaSb nucleation layer 102 may facilitate the annihilation/gliding of defects. It is advantageous to stop the propagation of defects with the use of the low temperature GaSb nucleation layer 102.

The nucleation layer 102 may be formed via a metal organic chemical vapor deposition (MOCVD) or a molecular beam epitaxy (MBE) process, or another such process. In an embodiment, the nucleation layer 102 may be used to fill the lowest silicon substrate 100 terraces with atomic bi-layers of the GaSb material to create an anti-phase domain-free virtual polar substrate. In some embodiments, the formation of the nucleation layer 102 may be performed at temperatures between about 400° Celsius and about 500 degrees Celsius.

Figure 1C:
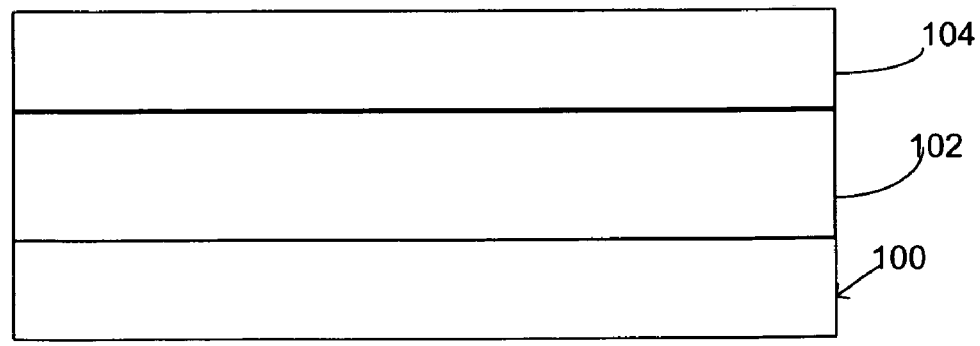

The nucleation layer 102 may provide for gliding dislocations and may control a lattice mismatch of between about 4% to about 8% between the silicon substrate 100 and a buffer layer 104 to be subsequently formed over the nucleation layer 102 (FIG. 1c). In an embodiment, the buffer layer 104 may comprise a large bandgap Ga(Al)AsSb buffer layer 104. In an embodiment, the Ga(Al)AsSb buffer layer 104 may comprise between about 0.3 μm to about 5 μm in thickness. In an embodiment, the buffer layer 104 may be grown to be lattice matched to an $In_{0.52}Al_{0.48}As$ material comprising a lattice parameter of about 5.869 angstroms that may be subsequently formed on the buffer layer 104.

The buffer layer 104 may also act as a device isolation layer on the substrate 100 due to the large bandgap of the buffer layer 104, which may comprise a graded buffer layer 104 in some embodiments. For example, a 50/50 Al Ga mixture may be mixed with the GaSb nucleation layer 102, and may be grown/graded to be lattice matched with a subsequently formed In Al As layer. In an embodiment, the AlAs may comprise a lattice constant of about 5.661 angstroms and the GaAs may comprise a lattice constant of about 5.6532 angstroms. The buffer layer 104 may be formed by MOCVD, MBE, chemical vapor deposition (CVD), and any other suitable technique, for example. An advantage of the buffer layer 104 is that it a relatively thin layer may be sufficient since only a single-step of the Ga(Al)AsSb buffer layer 104 is necessary between the thin GaSb nucleation layer 102 and a thin InAlAs bottom barrier layer that may be formed subsequently on the buffer layer 104.

Figure 1D:
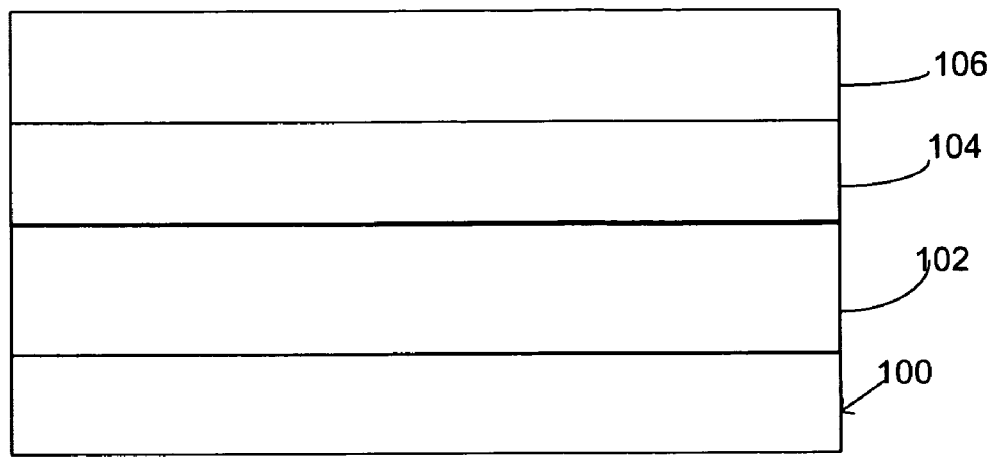
Figure 1E:
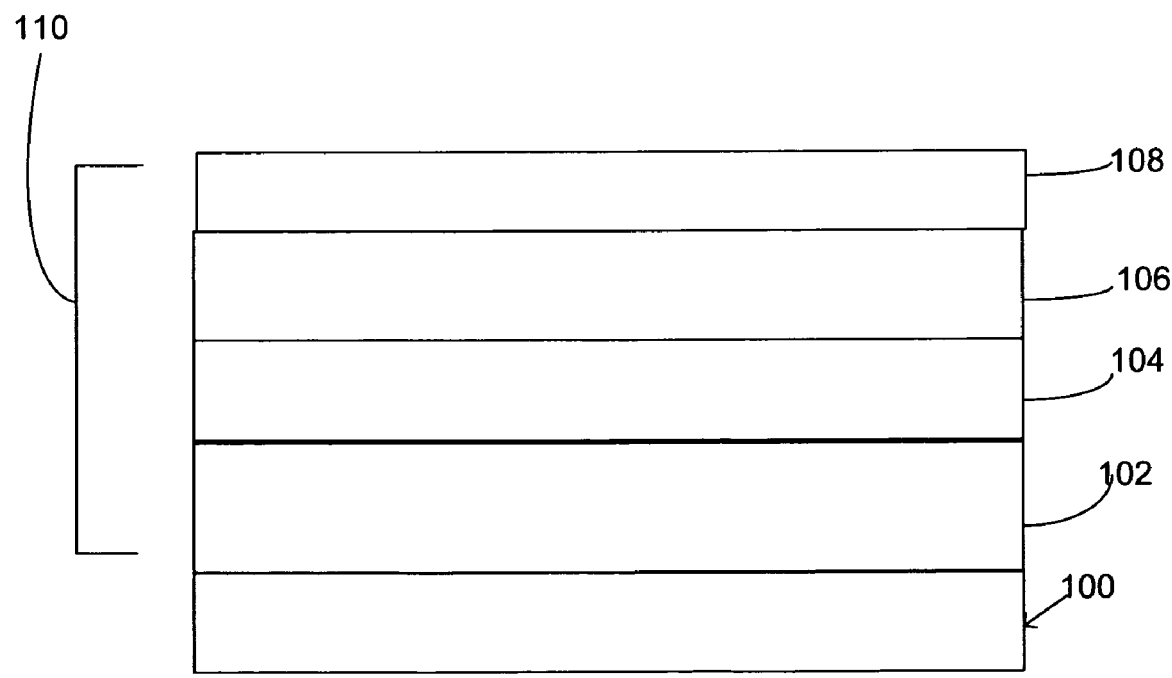

A bottom barrier layer 106 may be formed on the buffer layer 104 (FIG. 1d). The bottom barrier layer 106 may comprise a lattice matched $In_{0.52}Al_{0.48}As$ bottom barrier for InGaAs based quantum well structures in an embodiment. In an embodiment, the bottom barrier layer 106 may comprise about a 60 percent offset of a conduction band Ec. The bottom barrier layer 106 may be formed of a higher bandgap material than a quantum well layer to be formed thereon. The bottom barrier layer 106 may be of sufficient thickness to provide a potential barrier to charge carriers in a transistor stack in an embodiment. In one embodiment, the bottom barrier layer 106 may have a thickness of between approximately 100 Å-250 Å. In other embodiments, bottom barrier layer 106 may be between approximately 0.5 to about 1.0 μm.

A graded $In_xAl_{1-x}As$ layer 108 may be formed on the bottom barrier layer 106 (FIG. 1e) and/or on the buffer layer 104. In an embodiment, the concentration of the Indium in the graded $In_xAl_{1-x}As$ layer 108 may comprise about 52 to about 70 percent Indium. The percentage of aluminum in the graded $In_xAl_{1-x}As$ layer 108 may be adjusted to provide a balance-strained graded $In_xAl_{1-x}As$ layer.

By forming the graded $In_xAl_{1-x}As$ layer 108, dislocations may glide along relatively diagonal planes within the graded $In_xAl_{1-x}As$ layer. The graded $In_xAl_{1-x}As$ layer may be between about 0.5 microns and about 2.0 microns in some embodiments. In one embodiment, the nucleation layer 102, the buffer layer 104, the bottom barrier layer 106, and the graded $In_xAl_{1-x}As$ layer may form a dislocation filtering buffer architecture 110. This buffer architecture 110 may provide compressive strain for an InGaAs quantum well (QW) structure to be formed subsequently thereon. Furthermore, these layers may control lattice mismatch within about 4% to minimize threading dislocations.

In one example, an $In0.52Al0.48As$ layer can be grown on InP which is lattice matched and a $InxGa1-xAs$ quantum well can be grown on top of this $In0.52Al0.48As$ layer, which may act as a barrier layer. Based on the indium composition (x) in $InxGa1-xAs$ of the quantum well, the strain can be controlled inside the InGaAs quantum well. For example, a strain of about 1.0% may be achieved when an $In0.52Al0.48As$ barrier layer and an $In0.7Ga0.3As$ quantum well are used).

In another embodiment, an $InxGa1-xAs$ quantum well structure may be formed on a graded $In_xAl_{1-x}As$ layer (that may act as a barrier layer) and the strain can be controlled by controlling the indium composition (x) in the $InxGa1-xAs$ quantum well and in the graded $InxAl1-xAs$ layer. In the graded barrier case, the indium composition can be controlled in both the graded $In_xAl_{1-x}As$ barrier layer and the $InxGa1-xAs$ channel for controlling strain inside the $InxGa1-xAs$ channel.

Figure 1F:
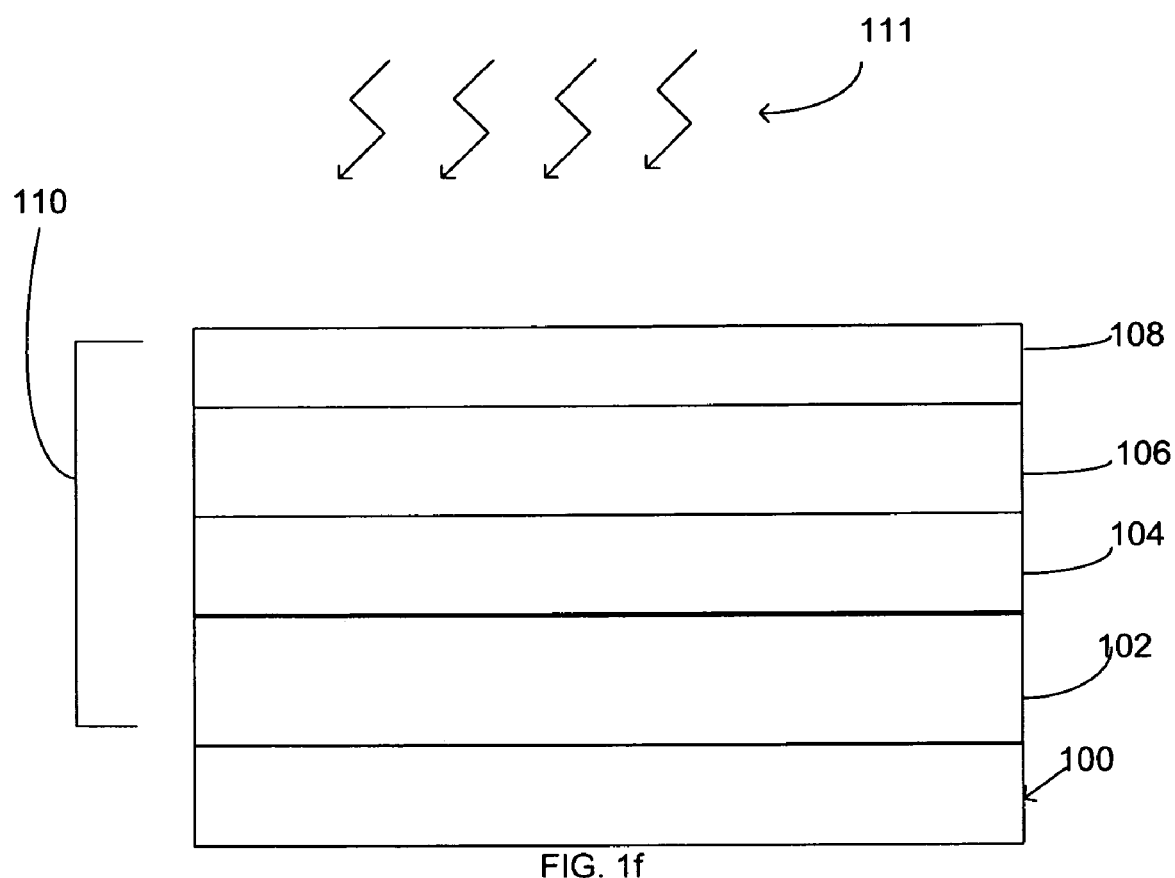

In-situ thermal cycle annealing 111 of the buffer architecture 110 may be performed after each step of layer formation of the buffer architecture 110 and/or after formation of the entire buffer architecture layers 110 (FIG. 1f). The annealing may be performed before a quantum well layer may be formed on the buffer architecture 110 for reducing/removing dislocations and defects in some embodiments. The buffer architecture may also comprise in an embodiment only one of the bottom barrier layer 106 and the graded $In_xAl_{1-x}As$ layer, either one of which may act as a barrier layer to a quantum well structure.

A quantum well layer 112 may be formed on the graded $In_xAl_{1-x}As$ layer 108 (FIG. 1g), or the quantum well layer 112 may be formed on the bottom barrier layer 106. The quantum well layer 112 may be formed of a material having a smaller bandgap than that of the graded $In_xAl_{1-x}As$ layer 108 and/or the bottom barrier layer 106. In one embodiment, the quantum well layer 112 may be formed of $In_xGa_{1-x}As$, where x equals between approximately 0.53 to about 0.8. The quantum well layer 112 may be of sufficient thickness to provide adequate channel conductance. In some embodiments, quantum well layer 112 may be between approximately 10 to about 50 nanometers. The quantum well layer 112 may provide high electron mobility and velocity for NMOS devices, and also may provide high hole mobility and velocity for PMOS devices, as compared with a Si-based device. This n-type channel material, InGaAs may comprise a larger conduction band offset (ΔEc~0.60 eV) with respect to the graded InAlAs layer, and provides the electron confinement inside the type-I quantum well (InGaAs).

Figure 1G:
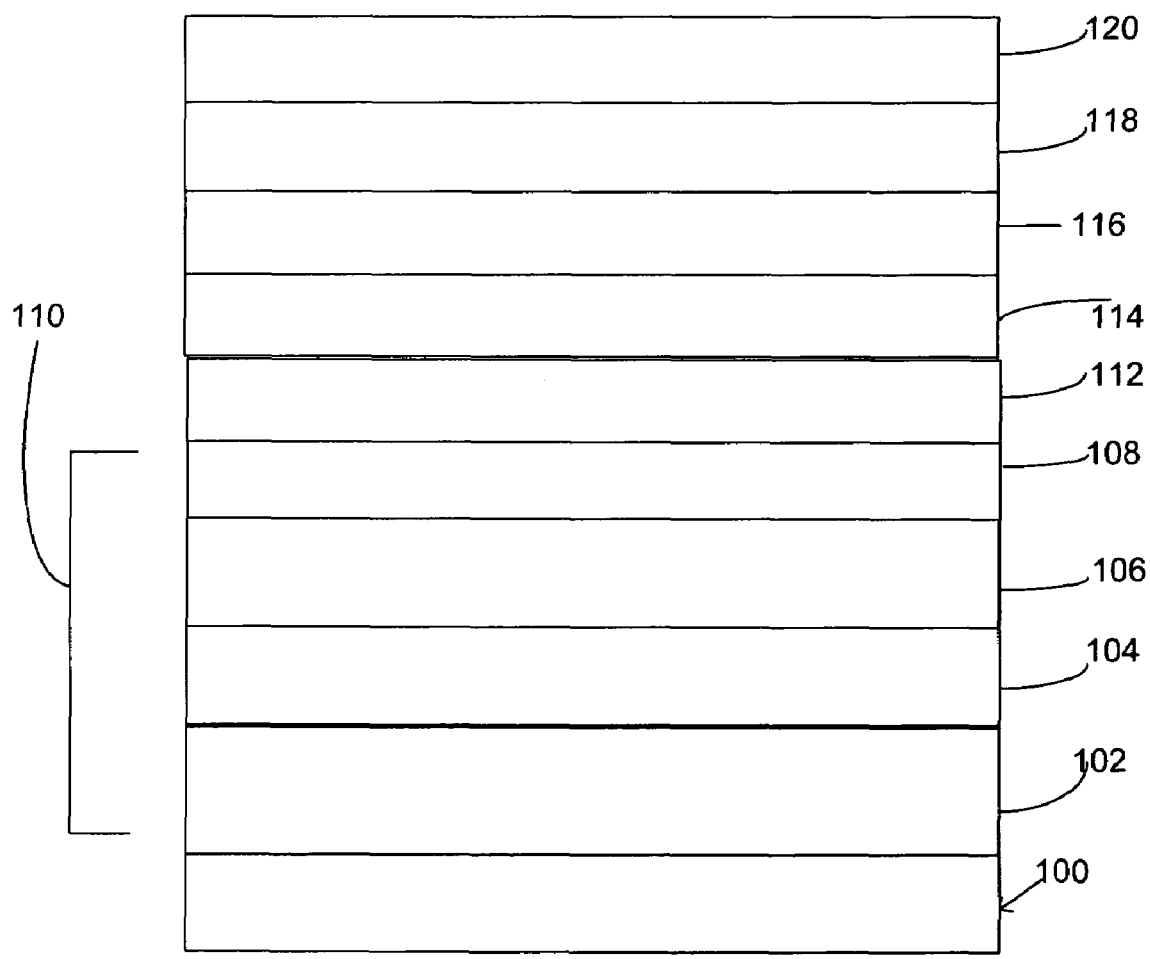

As further shown in FIG. 1g, a spacer layer 114 may be formed over the quantum well layer 112. The spacer layer 114 may be an $In_xAl_{1-x}As$, in some embodiments. The spacer layer 114 may provide for carrier confinement and reduced interaction between a doping layer and a two dimensional electron gas (2DEG) that may be formed inside the channel (i.e., the channel of quantum well layer 112). Still further, the spacer layer 114 may provide compressive strain to the channel of the quantum well layer 112. In various embodiments, spacer layer 114 may be approximately 20 angstroms to about 30 angstroms in thickness.

A doping layer 116 may be formed over spacer layer 112. Doping layer 116 may be delta-doped, modulation doped and/or combinations thereof. For example, in one embodiment the doping layer 116 may be a silicon modulation delta-doped layer having a thickness of approximately 3 angstroms to about 5 angstroms. For an NMOS device, doping may be implemented using silicon and tellurium (Te) impurities. As for a PMOS device, doping may be beryllium (Be) or carbon (C).

Referring still to FIG. 1g, an upper barrier layer 118 may be formed over the doping layer 116 to complete the device stack. In one embodiment, the upper barrier layer 118 may comprise an $In_xAl_{1-x}As$ barrier layer. The upper barrier layer 118 may have a thickness of between approximately 50 angstroms and about 500 angstroms, and may be a Schottky upper barrier layer 118 for gate control. An etch stop layer (optional) may be formed over upper barrier layer 118, and may be indium phosphide (InP) in some embodiments.

As further shown in FIG. 1g, a contact layer 120 may be present to act as a contact layer to provide source and drain contacts with low contact resistance and may be formed of $In_xGa_{1-x}As$, in various embodiments. For an NMOS device, the contact layer 120 may be n+doped, while for a PMOS device, the contact layer 120 may be p+doped. In an embodiment, the contact layer 120 may be between approximately 30 angstroms and about 300 angstroms in thickness.

While not shown in FIG. 1g, a fully completed device may further include source and drain electrodes. Furthermore, a dielectric material may be formed on the upper barrier layer 118 over which a gate electrode may be formed. Note that a gate recess etch may be performed within the upper barrier layer 118 to form a gate recess on which the dielectric layer and gate electrode may be formed. Thus a Schottky junction may be formed through which such a gate electrode may control the quantum well layer 112.

Accordingly, in various embodiments devices may be formed using a high electron mobility material to form high electron mobility transistors (HEMTs) having high speed and low power consumption. Such devices may have dimensions less than approximately 50 nm with a switching frequency of approximately 562 gigahertz (GHz). Such devices may be able to operate at between approximately 0.5-1.0 volts without significant reduction of drive current. Furthermore, embodiments may provide lower gate delay at a gate length than a silicon based device.

Figure 2:
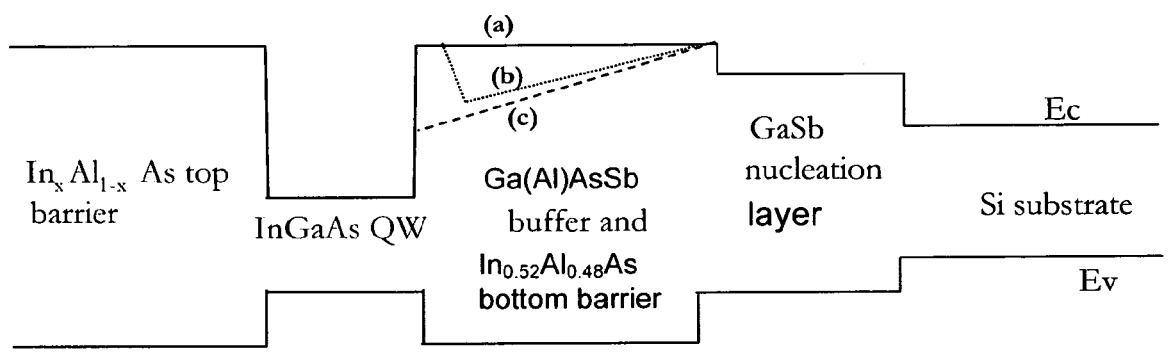
FIG. 2 represent a band diagram according to an embodiment of the present invention.

Note that three different possible paths, namely paths A, B and C are possible paths of this buffer architecture to provide compressive strain to a quantum well layer formed thereon (FIG. 2). Path A, which may correspond to a band gap of approximately 1.5 eV, may be obtained by providing buffer and barrier layers having an indium concentration of approximately 52%, namely $In_{0.52}Al_{0.48}As$. While such layer formation may provide for suitable carrier confinement characteristics, the difference in lattice constants between this type of layer and the underlying substrate may lead to a lattice constant mismatch and thus defects at the interface. Instead, path C shown with a dashed line, which may have relatively poor carrier confinement characteristics, provides a reduced lattice constant mismatch to avoid defects. For path C, a linearly increasing indium concentration from approximately 0% (i.e., AlAs) to approximately 70% indium (i.e., $In_{0.70}Al_{0.30}As$) may be present. In this case, the In composition in the graded $In_xAl_{1-x}As$ or InGaAlAsSb buffer is about the same as the In composition in the $In_xGa_{1-x}As$ channel formed above it, so that the channel is unstrained with respect to bottom barrier. Although the defect is less inside the QW layer, the carrier confinement is poor due to low valence band offset between $In_xAl_{1-x}As$ (e.g., x=0.7) bottom barrier and $In_xGa_{1-x}As$ (e.g., x=0.7) channel as well as not taking the advantage of the strain in the quantum well.

To achieve benefits of both carrier confinement and a relaxation characteristic that provides for a nearly fully relaxed (i.e., metamorphic) structure, path B may be implemented.

Referring still to FIG. 2 over this bottom barrier layer a QW layer may be formed with a relatively small band gap. Specifically, in one embodiment, a QW layer may be formed of indium gallium arsenide with x equal to 0.7 (i.e., $In_{0.7}Ga_{0.3}As$) such that the band gap is approximately 0.6 eV. To provide further compressive strain to this QW structure, a top barrier may be formed of indium aluminium arsenide having x equal to approximately 52% (i.e., $In_{0.52}Al_{0.48}As$), corresponding to a band gap of approximately 1.5 eV.

Figure 3:
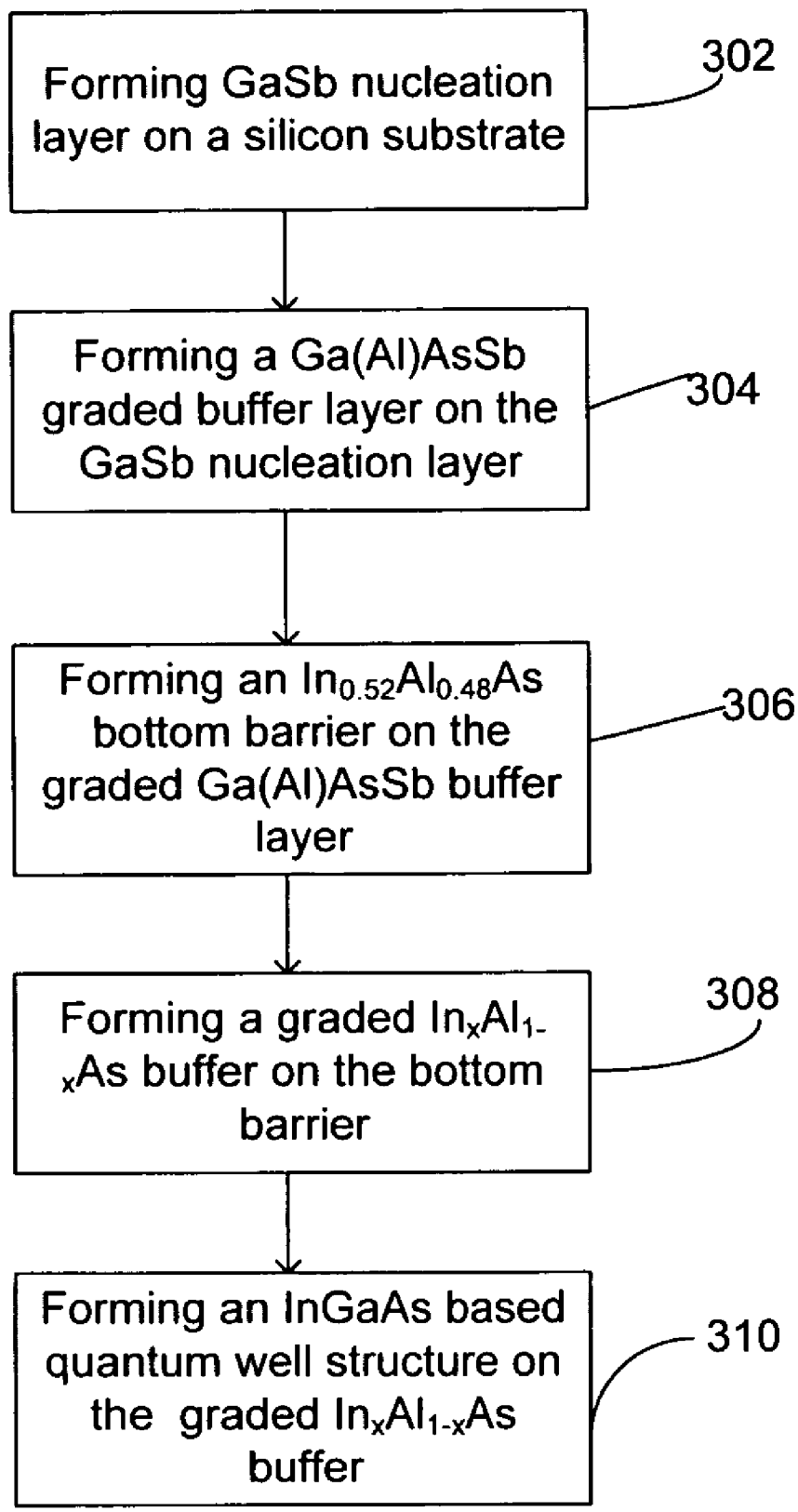
FIG. 3 represents a flow chart according to an embodiment of the present invention.

Referring now to FIG. 3, shown is a flow diagram of a method in accordance with an embodiment of the present invention. As shown in FIG. 3, step 302 comprises forming a GaSb nucleation layer on a silicon substrate. Next, at step 304, a Ga(Al)AsSb graded buffer layer may be formed on the GaSb nucleation layer. At step 306, a $In_{0.52}Al_{0.48}As$ bottom barrier layer may be formed on the Ga(Al)AsSb graded buffer layer. At step 308, a graded $In_xAl_{1-x}As$ buffer may be formed on the bottom barrier layer, and at step 310, an InGaAs based quantum well structure may be formed on the graded $In_xAl_{1-x}As$ buffer. While shown with this particular implementation in the embodiment of FIG. 3, the scope of the present invention is not limited in this regard.

Thus, the benefits of the embodiments of the present invention include, but are not limited to, forming a bridge lattice constant between the substrate and a channel structure of a HEMT device, providing a large conduction band offset between a bottom barrier, InAlAs and the channel structure such as InGaAs, and providing device isolation and eliminating parallel conduction from the buffer layer to the channel layer due to the larger bandgap (GaAlAsSb and InAlAs layers) buffer layers. The buffer architecture of the embodiments of the present invention serves to lower parasitics resistances. Additionally, the buffer architecture serves as bottom barrier for carrier confinement inside the InGaAs quantum well structure.

Although the foregoing description has specified certain steps and materials that may be used in the method of the present invention, those skilled in the art will appreciate that many modifications and substitutions may be made. Accordingly, it is intended that all such modifications, alterations, substitutions and additions be considered to fall within the spirit and scope of the invention as defined by the appended claims. In addition, it is appreciated that certain aspects of microelectronic devices are well known in the art. Therefore, it is appreciated that the Figures provided herein illustrate only portions of an exemplary microelectronic device that pertains to the practice of the present invention. Thus the present invention is not limited to the structures described herein.

What is claimed is:

1. A method comprising:
   forming a GaSb nucleation layer on a substrate;
   forming a Ga(Al)AsSb buffer layer on the GaSb nucleation layer;
   forming an $In_{0.52}Al_{0.48}As$ bottom barrier layer on the Ga(Al)AsSb buffer layer; and
   forming a graded $In_xAl_{1-x}As$ layer on the $In_{0.52}Al_{0.48}As$ bottom barrier layer.

2. The method of claim 1 further comprising wherein the substrate comprises a high resistivity p-type silicon substrate with a (100) off-cut in the range of about 2 to about 8 degrees towards a direction.

3. The method of claim 1 further comprising wherein the GaSb nucleation layer comprises a low melting point material and a thickness of between about 50 angstroms and about 300 angstroms.

4. The method of claim 1 further comprising wherein the Ga(Al)AsSb buffer layer comprises a large bandgap Ga(Al)AsSb buffer layer and a thickness of between about 0.3 microns and about 2 microns.

5. The method of claim 1 further comprising wherein the Ga(Al)AsSb buffer layer is lattice matched to the $In_{0.52}Al_{0.48}As$ bottom barrier layer.

6. The method of claim 1 further comprising forming the Ga(Al)AsSb buffer layer by grading the Ga(Al)AsSb buffer layer to substantially lattice match with the $In_{0.52}Al_{0.48}As$ bottom barrier layer.

7. The method of claim 1 further comprising wherein the graded $In_xAl_{1-x}As$ layer comprises between about 52 percent and 70 percent indium.

8. The method of claim 1 further comprising forming an InxGa1-xAs quantum well structure on the graded $In_xAl_{1-x}As$ layer, wherein the strain can be controlled by controlling the indium composition in the InxGa1-xAs quantum well structure and in the InxAl1-xAs layer.

9. The method of claim 8 further comprising wherein the InGaAs quantum well structure comprises a strained layer formed of indium gallium arsenide.

10. The method of claim 1 further comprising wherein forming the nucleation layer, the buffer layer, the bottom barrier layer, and the graded $In_xAl_{1-x}As$ layer may comprise forming a buffer architecture, and wherein the buffer architecture may be in-situ thermal annealed to remove dislocations.

11. A method comprising:
forming a dislocation filtering buffer structure comprising a GaSb nucleation layer disposed on a substrate, a Ga(Al)AsSb buffer layer disposed on the GaSb nucleation layer, an $In_{0.52}Al_{0.48}As$ bottom barrier layer disposed on the Ga(Al)AsSb buffer layer, and a graded $In_xAl_{1-x}As$ layer disposed on the $In_{0.52}Al_{0.48}As$ bottom barrier layer; and
forming an quantum well structure on the dislocation filtering buffer structure.

12. The method of claim 11 further comprising:
forming a spacer layer over the quantum well layer;
forming a delta-doped layer over the spacer layer; and
forming an upper barrier layer over the delta-doped layer.

13. A structure comprising:
a GaSb nucleation layer disposed on a substrate;
a Ga(Al)AsSb buffer layer disposed on the GaSb nucleation layer;
an $In_{0.52}Al_{0.48}As$ bottom barrier layer disposed on the Ga(Al)AsSb buffer layer; and
a graded $In_xAl_{1-x}As$ layer disposed on the $In_{0.52}Al_{0.48}As$ bottom barrier layer.

14. The structure of claim 13 comprising wherein the substrate comprises a high resistivity p-type silicon substrate with a (100) off-cut in the range of about 2 to about 8 degrees towards a direction.

15. The structure of claim 13 wherein the GaSb nucleation layer comprises a low melting point material and a thickness of between about 50 angstroms and about 300 angstroms.

16. The structure of claim 13 wherein the wherein the Ga(Al)AsSb buffer layer comprises a large bandgap Ga(Al)AsSb buffer layer and a thickness of between about 0.3 microns and about 2 microns.

17. The structure of claim 13 further comprising wherein the graded $In_xAl_{1-x}As$ layer comprises between about 52 percent and 70 percent indium.

18. The structure of claim 17 further comprising a quantum well structure disposed on the graded $In_xAl_{1-x}As$ layer.

19. The structure of claim 18 further comprising a spacer layer disposed on the quantum well structure, a delta-doped layer disposed on the spacer layer; and an upper barrier layer disposed on the delta-doped layer.

20. The structure of claim 19 wherein the structure comprises a high electron mobility transistor (HEMT), wherein the quantum well layer comprises a channel of the HEMT.

* * * * *